United States Patent [19]

Nakamura et al.

[11] Patent Number: 4,649,310
[45] Date of Patent: Mar. 10, 1987

[54] PIEZOELECTRIC VIBRATING ELEMENT

[75] Inventors: Takeshi Nakamura, Uji; Ikuo Matsumoto, Nagaokakyo; Kenji Ando, Kawasaki, all of Japan

[73] Assignee: Murata Manufacturing Co., Ltd., Japan

[21] Appl. No.: 685,328

[22] Filed: Dec. 24, 1984

[30] Foreign Application Priority Data

Dec. 26, 1983 [JP] Japan ................. 58-248826

[51] Int. Cl.[4] .......................................... H01L 41/08
[52] U.S. Cl. ..................... 310/321; 310/312; 29/25.35
[58] Field of Search ............ 310/311, 312, 320, 322, 310/324, 321; 29/25.35

[56] References Cited

U.S. PATENT DOCUMENTS

| 3,488,530 | 1/1970 | Staudte | 310/321 X |
|---|---|---|---|
| 3,634,787 | 1/1972 | Newell | 310/321 X |
| 4,037,121 | 7/1977 | Nakamura et al. | 310/321 |
| 4,156,156 | 5/1979 | Sweany et al. | 310/312 |
| 4,433,264 | 2/1984 | Nishiyama et al. | 310/321 |
| 4,469,975 | 9/1984 | Nakamura | 310/321 |

Primary Examiner—Mark O. Budd
Attorney, Agent, or Firm—Ostrolenk, Faber, Gerb & Soffen

[57] ABSTRACT

A vibrating element for the vibration under an expansion mode has a substrate made of a constant modulus alloy having a plate shape which is symmetrical along a line extending across the substrate. At least one pair of projections extends from opposite sides of the substrate symmetrically with respect to the line. A thin piezoelectric film is deposited on the substrate, and a vibration electrode film is further deposited on the piezoelectric film. The pair of projections are provided to be trimmed to adjust the vibration frequency of the vibrating element.

30 Claims, 6 Drawing Figures

PIEZOELECTRIC VIBRATING ELEMENT

BACKGROUND OF THE INVENTION

1. Field of the invention

The present invention relates to a vibrating element capable of vibrating under an expansion mode and, more particularly, to a piezoelectric vibrator defined by a thin piezoelectric film deposited on a substrate made of a constant modulus alloy and a vibration electrode film deposited on the piezoelectric film. It also relates to a method for adjusting the vibration frequency of such a vibrating element.

2. Description of the Prior Art

As shown in FIG. 1, a typical piezoelectric vibrator 101 of the prior art has a substrate 102 on which a piezoelectric film 103 is deposited by way of sputtering, and a vibration electrode film 104 which is further deposited on piezoelectric film 103. The electric signal is applied between substrate 102 and electrode film 104.

In FIG. 2, an equivalent circuit of vibrating element 101 is shown. The equivalent circuit includes a resonance inductance L, a resistance R and a series capacitance Cs, which are connected in series, and a parallel capacitance Cp, which is connected in parallel with the series connection of L, R and Cs. The vibration characteristics can be evaluated by using a ratio $\phi(=Cp/Cs)$, such that the smaller the ratio $\phi$, the better the vibration characteristics.

The vibration frequency is determined by width between opposite sides 105a and 105b of the vibrator 101 such that the vibration frequency becomes higher as the width becomes narrower. Accordingly, the vibration frequency has in the past been adjusted by trimming the opposite sides 105a, 105b along the chain lines shown in FIG. 1(a). However, cutting the opposite sides in a plane is very difficult.

For this reason it has been proposed that instead of cutting the opposite sides, slits Sa and Sb be formed at opposite sides 105a and 105b, l as shown in FIG. 1(a). Although this method is easier than cutting the opposite sides, the formation of such slits Sa and Sb results in the increase of the ratio $\phi$ and, at the same time, in the decrease of the difference DF between the antiresonant frequency and resonant frequency, thus deteriorating the vibration characteristics.

SUMMARY OF THE INVENTION

The present invention has been developed with a view to substantially solving the above described problems and has for its essential object to provide an improved vibrating element in which the vibration frequency can be adjusted with high accuracy in a simple manner without deteriorating the vibration characteristics, and also to provide a method for adjusting such a vibration frequency.

It is a further object of the present invention to provide a vibrating element which can readily be manufactured at low cost.

In accomplishing these and other objects, a vibrating element according to the present invention, which vibrates under an expansion mode, comprises a substrate made of a constant modulus alloy having a plate shape which is symmetrical along a line extending across the substrate. It further comprises at least one pair of projections extending from opposite sides of the substrate symmetrically with respect to the line. A thin piezoelectric film is deposited on the substrate, and a vibration electrode film is further deposited on the piezoelectric film. The pair of projections are provided to be trimmed to adjust the vibration frequency of the vibrating element.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DESCRIPTION OF THE PREFERRED EMBODIMENTS

Figure 1A:
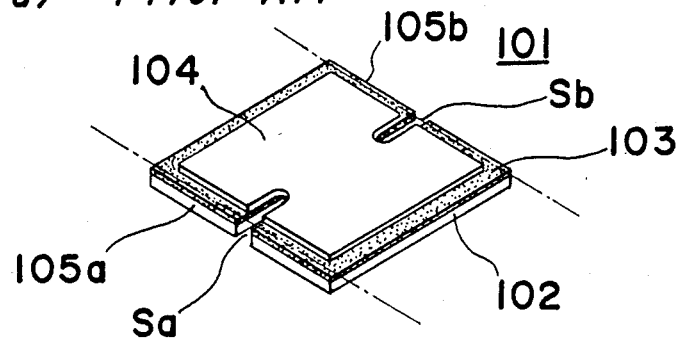
FIG. 1(a) is a perspective view of a vibrating element according to the prior art.
Figure 1B:
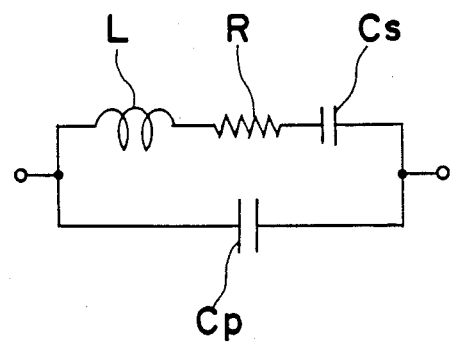
FIG. 1(b) is a diagram showing an equivalent circuit of the element shown in FIG. 1(a)
Figure 2:
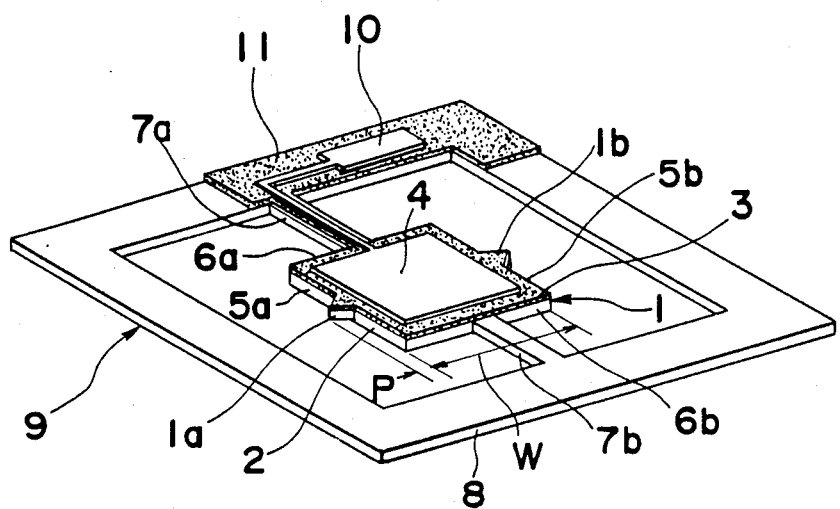
FIG. 2 is a perspective view of a vibrating element according to a preferred embodiment of the present invention.

Referring to FIG. 2, a piezoelectric resonator is shown according to a preferred embodiment of the present invention. A piezoelectric vibrating element 1 comprises a vibration substrate 2 and a piezoelectric film 3, made of, e.g., ZnO, deposited on substrate 2 through the step of, for example, sputtering. A vibration electrode film 4 is further deposited on piezoelectric film 3 through the step of, for example, vapor deposition.

The vibrating element 1 has a rectangular configuration defined by four sides 5a, 5b, 6a and 6b and is provided with a pair of triangular projections 1a and 1b extending outwardly from the opposite sides 5a and 5b at positions symmetrical with respect to a line extending between the centers of the opposite sides 6a and 6b. In this arrangement, opposite sides 5a and 5b serve as the frequency setting sides, such that the peripheral configuration of the sides 5a and 5b and the distance W between the sides 5a and 5b determines the vibration frequency of the vibrating element 1.

The vibrating element 1 is connected to a pair of arms 7a and 7b extending outwardly and radially from the centers of opposite sides 6a and 6b, respectively. The arms 7a and 7b are further connected to a frame 8 so that the vibrating element 1 can be supported only by arms 7a and 7b. The frame 8 can be supported in a suitable casing (not shown), for example, at its four corners.

According to the preferred embodiment, substrate 2, arms 7a and 7b, and frame 8 are made of a constant modulus alloy, such as Elinvar, Invar, or Co-elinvar, and can be formed integrally through a known step, such as pressing or etching. Furthermore, the piezoelectric film 3 extends along arm 7a and partly on frame 8 at a place indicated by number 11. Similarly, the vibration electrode film 4 extends to a terminal 10 along and on piezoelectric film 3. This arrangement is formed by using suitable masks during the deposition of piezoelectric film 3 and during the deposition of vibration electrode film 4. In this arrangement, the extended part 11 of the piezoelectric film 3 serves as an insulation layer and the extended part 10 of the electrode serves as a terminal for the external connection. For example, terminal 10 may be soldered to a lead line.

Figure 3:
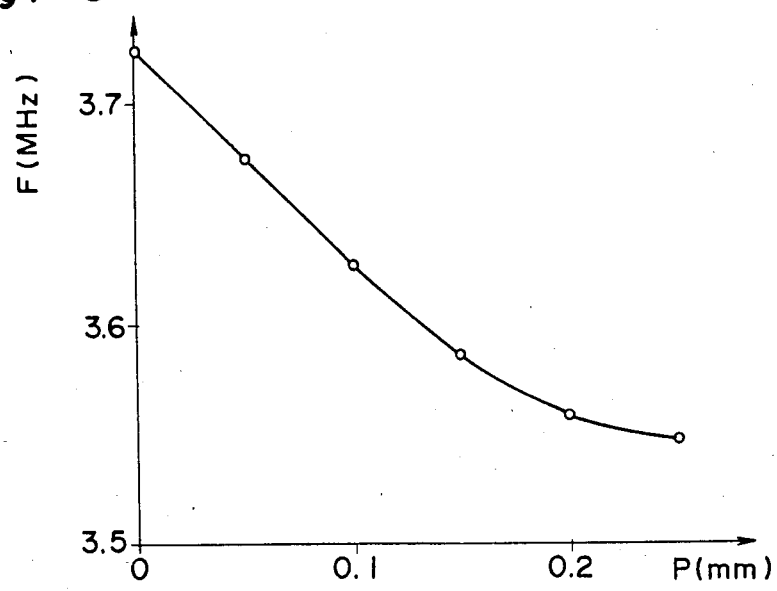
FIG. 3 is a graph showing a relationship between the length of projections provided to the vibrating element and the vibration frequency.

According to the present invention, the vibration frequency is adjusted by trimming the tops of triangular projections 1a and 1b, preferably the same amount. The change of the vibration frequency with respect to the change of the height P of the triangular projection is shown in the graph of FIG. 3. As apparent from the graph, the vibration frequency increases as the height P of the projection decreases. A vibration frequency F0, when there is no projection on the opposite sides 5a and 5b, can be given by the following equation.

$$F0 = \frac{1}{2W} \sqrt{\frac{C}{D}},$$

wherein C is a constant as follows, $$C = \frac{1-P}{(1-2P)(1+P)} E.$$

P is Poisson's ratio, E is Young's modulus, D is density and W is the distance between opposite edges 5a and 5b that determines the vibration frequency.

Thus, when designing the vibrator of the present invention, the size of vibrating element 1 is determined such that, if there were no triangular projections, it would vibrate at a frequency slightly higher that the required frequency, and if there were full triangular projections, it would vibrate at a frequency slightly lower than the required frequency. Thus, during the trimming of the tops of the triangular projections, the vibration frequency of vibrating element 1 gradually increases. When vibration frequency is at the required frequency, the trimming is stopped. Thus, the adjusted vibrating element 1 will have small projections at its opposite sides 5a and 5b, which projections may not be triangular any more, but more likely be trapezoidal. The trimming is done, for example, by using a laser cutter.

Figure 4:
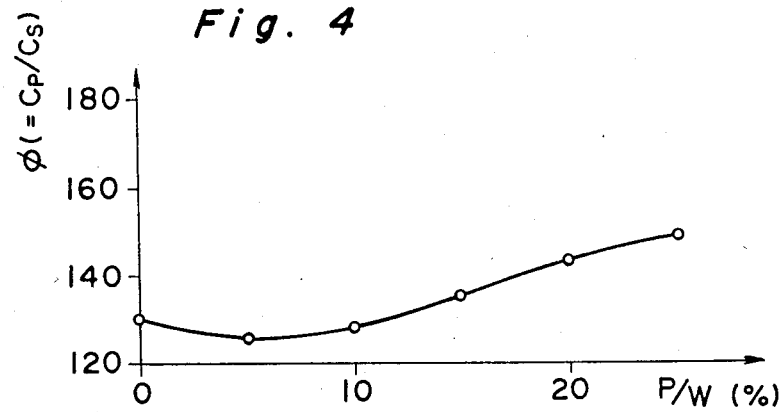
FIG. 4 is a graph showing a relationship between a ratio of the length of the projection to the width of the vibrating element and a ratio $\phi$.

Referring to FIG. 4, a relationship between the ratio (P/W) of height P of the projection to the width W of the vibrating element 1 and the ratio $\phi(=Cp/Cs)$ is shown. According to the vibrating element of the present invention, the ratio $\phi(=Cp/Cs)$ is relatively low when the ratio (P/W) of height P of the projection to the width W of the vibrating element 1 is relatively low. In fact, when the ratio P/W is between 0-10%, the ratio $\phi$ shows a lower figure than the vibrating element 1 that has no projection. Thus, in the region where the ratio P/W is between 0-10%, the vibration characteristics are even better than that of the vibrating element without any projection.

Figure 5:
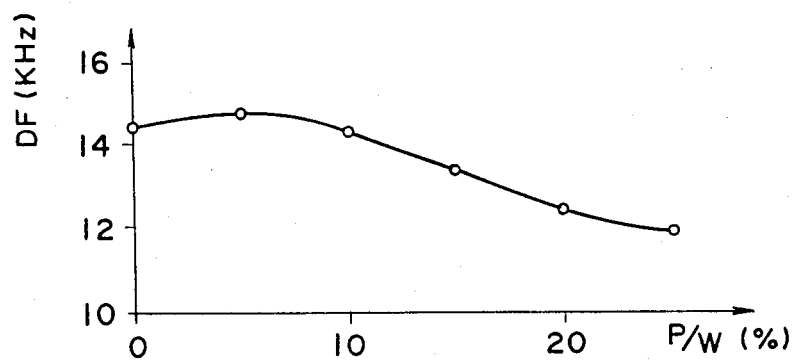
FIG. 5 is a graph showing a relationship between a ratio of the length of the projection to the width of the vibrating element and a difference DF between antiresonant frequency and resonant frequency.

Furthermore, referring to FIG. 5, a relationship between the ratio P/W and a difference DF between antiresonant frequency and resonant frequency is shown. According to the present invention, the vibrating element 1 will have a sufficiently high difference DF in the region where the ratio P/W is between 0-20% and, therefore, in that region, good vibration characteristics can be ensured.

According to the present invention, vibrating element 1 can be of a configuration other than rectangular, such as a square or circular configuration. Furthermore, projections 1a and 1b can be of a configuration other than triangular, such as a rectangular, trapezoidal or semicircular configuration. Moreover, more than one projection may be provided on each of the opposite sides 5a and 5b so long as the projections are symmetrical with respect to a line extending between the centers of the opposite sides 6a and 6b and through the node point.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of the appended claims.

What is claimed is:

1. An expansion mode vibrating element comprising:
   a substrate made of a constant modulus alloy having a plate shape which is symmetrical along a line extending across the substrate;
   first and second sets of N projections extending from respective opposite sides of said substrate symmetrically with respect to said line, N being an integer greater than zero;
   a thin piezoelectric film deposited on said substrate; and
   a vibration electrode film deposited on said piezoelectric film, wherein the vibration frequency of said vibrating element may be adjusted by trimming said projections;
   wherein the ratio P/W of the length of said projections to the width of said substrate between said projections is about 0-20 percent.

2. The vibrating element of claim 1, wherein said projections are integral with said substrate.

3. Apparatus as in claim 1, wherein the ratio P/W is about 0-10 percent.

4. The vibrating element of claim 2, wherein said projections are further integral with said thin piezoelectric film deposited on said substrate.

5. A method for making a vibrating element which vibrates under an expansion mode, said method comprising the steps of;
   forming a substrate made of a constant modulus alloy having a plate shape which is symmetrical along a line extending across the substrate;
   forming first and second sets of N projections extending from respective opposite sides of said substrate symmetrically with respect to said line, N being an integer greater than zero;
   depositing a thin piezoelectric film on said substrate;
   depositing a vibration electrode film on said piezoelectric film; and
   trimming said projections to adjust the vibration frequency of said vibrating element.

6. The method of claim 5, wherein said substrate is generally rectangular in shape.

7. The method of claim 6, wherein said projections are generally triangular in shape.

8. The method of claim 7, wherein N=1.

9. The method of claim 5, wherein said projections are integral with said substrate.

10. The method of claim 9, wherein said projections further are integral with and extend from said piezoelectric film.

11. A method for controlling a vibration frequency of a vibrating element which vibrates under an expansion mode, said vibrating element comprising a substrate made of a constant modulus alloy having a plate shape which is symmetrical along a line extending across the substrate, a thin piezoelectric film deposited on said substrate and a vibration electrode film deposited on said piezoelectric film, said controlling method comprising the steps of:

forming first and second sets of N projections extending from respective opposite sides of said substrate symmetrically with respect to said line; and trimming said projections to adjust the vibration frequency of said vibrating element.

12. The method of claim 11, wherein said substrate is generally rectangular in shape.

13. The method of claim 12, wherein said projections are generally triangular in shape.

14. The method of claim 13, wherein N=1.

15. The method of claim 11, including trimming said projections to increase the vibration frequency of said vibrating element to a desired frequency.

16. The method of claim 11, wherein said projections are integral with said substrate.

17. The method of claim 16, wherein said projections further extend from and are integral with said piezoelectric film.

18. An expansion mode vibrating element comprising:

a substrate made of a constant modulus alloy having a plate shape which is symmetrical along a line extending across the substrate;

first and second sets of N projections extending from respective opposite sides of said substrate symmetrically with respect to said line, N being an integer greater than zero;

a thin piezoelectric film deposited on said substrate; and a vibration electrode film deposited on said piezoelectric film wherein the vibration frequency of said vibrating element may be adjusted by trimming said projections;

wherein said substrate is generally rectangular in shape.

19. The vibrating element of claim 18, wherein said projections are generally triangular in shape.

20. The vibrating element of claim 19, wherein N=1.

21. An expansion mode vibrating element comprising:

a substrate made of a constant modulus alloy having a plate shape which is symmetrical along a line extending across the substrate;

a thin piezoelectric film deposited on said substrate;

a vibration electrode film deposited on said piezoelectric film; and first and second sets of N projections extending integrally from respective opposite sides of said substrate symmetrically with respect to said line, N being an integer greater than 0, the vibration frequency of said vibrating element being adjustable by trimming said projections;

wherein the ratio P/W of the length of said projections to the width of said substrate between said projections is about 0–20 percent.

22. The vibrating element of claim 21, wherein the vibration frequency of said vibrating element may be increased by trimming said projections.

23. The vibrating element of claim 21 wherein said projections further extend from and are integral with said piezoelectric film.

24. Apparatus as in claim 21, wherein the ratio P/W is about 0–10 percent.

25. A method for making an expansion mode vibrating element, said method comprising the steps of:

forming a substrate made of a constant modulus alloy having a plate shape which is symmetrical along a line extending across the substrate;

forming first and second sets of N projections extending from respective opposite sides of said substrate symmetrically with respect to said line, N being an integer greater than 0;

depositing a thin piezoelectric film on said substrate;

depositing a vibration electrode film on said piezoelectric film; and trimming projections to increase the vibration frequency of said vibrating element to a desired frequency.

26. The method of claim 25, wherein said projections are integral with said substrate.

27. The method of claim 26, wherein said projections also extend from and are integral with said piezoelectric film.

28. The method of claim 25, wherein the ratio P/W of the length of said projections to the width of said substrate between said projections is about 0–20 percent.

29. The method of claim 28, wherein the ratio P/W is about 0–10 percent.

30. An expansion mode vibrating element comprising:

a substrate made of a constant modulus alloy having a plate shape which is symmetrical along a line extending across the substrate;

a thin piezoelectric film deposited on said substrate;

a vibration electrode film deposited on said piezoelectric film;

first and second sets of N projections extending from first respective opposite sides of said substrate symmetrically with respect to said line, N being an integer greater than 0, the vibration frequency of said vibrating element being adjustable by trimming said projections;

a frame surrounding the substrate, having first and second arms extending within the frame to second respective opposite sides of said substrate for supporting the substrate, said second sides being distinct from said above-mentioned first sides which have said projections extending therefrom, and said substrate, said arms, and said frame being integral with one another.

* * * * *